United States Patent [19]

Richardson et al.

[11] Patent Number: 4,482,816
[45] Date of Patent: Nov. 13, 1984

[54] PULSE CIRCUITS

[75] Inventors: Robert Richardson; Anthony T. Barker, both of Chelmsford, England

[73] Assignee: The Marconi Company Limited, Stanmore, England

[21] Appl. No.: 402,343

[22] Filed: Jul. 27, 1982

[30] Foreign Application Priority Data

Aug. 8, 1981 [GB] United Kingdom ............... 8124319

[51] Int. Cl.³ .............................................. H03K 3/45
[52] U.S. Cl. ..................................... 307/106; 328/65; 331/87; 361/409
[58] Field of Search ................. 307/106, 108; 331/87; 328/65, 67; 361/409, 414; 174/68.5

[56] References Cited

U.S. PATENT DOCUMENTS 3,163,782 12/1964 Ross ................................. 307/88.5
3,436,687 4/1969 Andrews, Jr. et al. .............. 333/29
4,090,140 5/1978 Carter ................................. 328/65
4,160,214 7/1979 Colin et al. ......................... 328/65

FOREIGN PATENT DOCUMENTS 580844 9/1946 United Kingdom .
711431 6/1954 United Kingdom .
855292 11/1960 United Kingdom .
974483 11/1964 United Kingdom .
1040071 8/1966 United Kingdom .
1065152 4/1967 United Kingdom .
1273441 5/1972 United Kingdom .
1356367 6/1974 United Kingdom .
1416571 12/1975 United Kingdom .
1470695 4/1977 United Kingdom .

Primary Examiner—A. D. Pellinen
Assistant Examiner—T. E. De Boer
Attorney, Agent, or Firm—Spencer & Frank

[57] ABSTRACT

A pulse circuit forms part of a radar transmitter in which a pulse forming network is used to generate a high current pulse at relatively low voltage and to feed it via a transformer to a magnetron which operates at typically 30 kV. A number of pulse forming networks are connected in parallel and are discharged by respective thyristors. The outputs of the pulse forming networks are combined so as to provide a low voltage pulse (of the order of 600 volts) having sufficient power to drive a radar transmitter. The pulse forming networks must each be capable of handling very large current and must have characteristics which are identical to each other. To enable these requirements to be met, each pulse forming network includes an inductor which is formed as a coiled thin conductive layer lying on the surface of an electrically insulating board. It is formed by printed circuit board techniques and a mirror image coil is formed on both sides of a double sided printed circuit board. All pulse forming networks are connected via a common double sided printed circuit board to the primary winding of a pulse transformer.

5 Claims, 4 Drawing Figures

FIG. I.

PULSE CIRCUITS

BACKGROUND OF THE INVENTION

This invention relates to pulse circuits which are capable of generating high power pulses of short duration. A circuit of this kind can be used to provide the operating power for a high power oscillator, such as a magnetron, which forms part of a radar transmitter. Such a pulse circuit is sometimes termed a radar pulse modulator. A radar transmitter transmits pulses having a very low mark-to-space ratio, that is to say, transmitted short pulses are spaced apart in time by relatively long intervals during which echoes of the pulses are returned by intercepted radar targets to a radar receiver. The useful range of a radar is related to the power transmitted during the short pulse periods and it is therefore very important to maximimise the power of these pulses, whilst ensuring that the pulses turn on and turn off cleanly without the generation of excessive noise. Following the turn off, or decay, of a transmitted short pulse, the receiver of the radar is enabled so that it can detect weak radar echoes. It is clearly important to ensure that the trailing edges of the transmitted short pulses decay very rapidly and cleanly so that they do not mask echoes received after only a very short delay from targets at very close range.

It is customary to use pulse forming networks to generate pulses of the required characterstics. In a pulse forming network, an array of capacitors and one or more inductors are charged to a required voltage level, and when fully charged the network is discharged, typically into a pulse transformer which raises the voltage to a level (typically 30 kV) at which it can be used to drive a magnetron oscillator. It has previously been usual to use a hydrogen thyratron or a similar device, as a switch to discharge the pulse forming network. Because thyatrons can operate at reasonably high voltages (e.g. several thousand volts), the current handling capacity of such pulse forming networks has been relatively modest.

Although in principle it is becoming desirable to use switchable semiconductor devices to discharge a pulse forming network, severe difficulties are encountered in practice in designing and manufacturing a network which is capable of handling with sufficient precision and consistency the very large currents involved. Because semiconductor switches are not capable of handling relatively large voltages, the pulse current must be proportionately higher to enable the overall power of the system to be sufficiently great, and the present invention seeks to provide an improved pulse circuit and a pulse forming network which is suitable for use in a pulse circuit which uses solid state switches.

SUMMARY OF THE INVENTION

According to this invention, a pulse circuit includes a plurality of pulse forming networks, each network comprising an inductor formed as a coiled thin conductive layer lying on the surface of an electrically insulating board, and a plurality of capacitors mounted on the board and electrically connected to predetermined points of the conductive track; the networks being mounted on a common multilayer printed circuit board which connects the outputs of the plurality of pulse forming networks in parallel to a common load, two conductive layers of the common board constituting respective current flow and return paths to minimise the inductance of the connection; and means for periodically charging and then discharging the inductor and the capacitors of the networks to generate an electrical pulse of predetermined characteristics.

In order to provide an inductor having a large inductance, but low electrical resistance, inductive tracks composed of thin conductive layers are formed on both sides of the electrically insulating board so as to be aligned with each other. In this case electrical connections conveniently pass through the board itself so that the capacitors are connected to corresponding points on both coils.

The means for discharging the inductors and capacitors of each network preferably comprises a switchable thyristor. This is a semiconductor device which is capable of handling potentials of up to 1000 volts, and thus to achieve a high power rating, the pulse circuit must generate the relatively low voltage pulse at a very high current level.

Preferably the common load is a pulse transformer which is operative to transform the pulse to a required higher voltage. The transformer converts the pulse to a voltage which is of sufficient amplitude to drive a magnetron oscillator, and a typical voltage level is of the order of 30 kV. The parallel arrangement of pulse forming networks has the very great advantage that failure of any one does not cause the complete failure of the whole unit, but instead merely reduces the available power.

BRIEF DESCRIPTION OF THE DRAWINGS

The invention is further described by way of example with reference to the accompanying drawings, in which.

DETAILED DESCRIPTION OF THE PREFERRED EMBODIMENT

Figure 1:
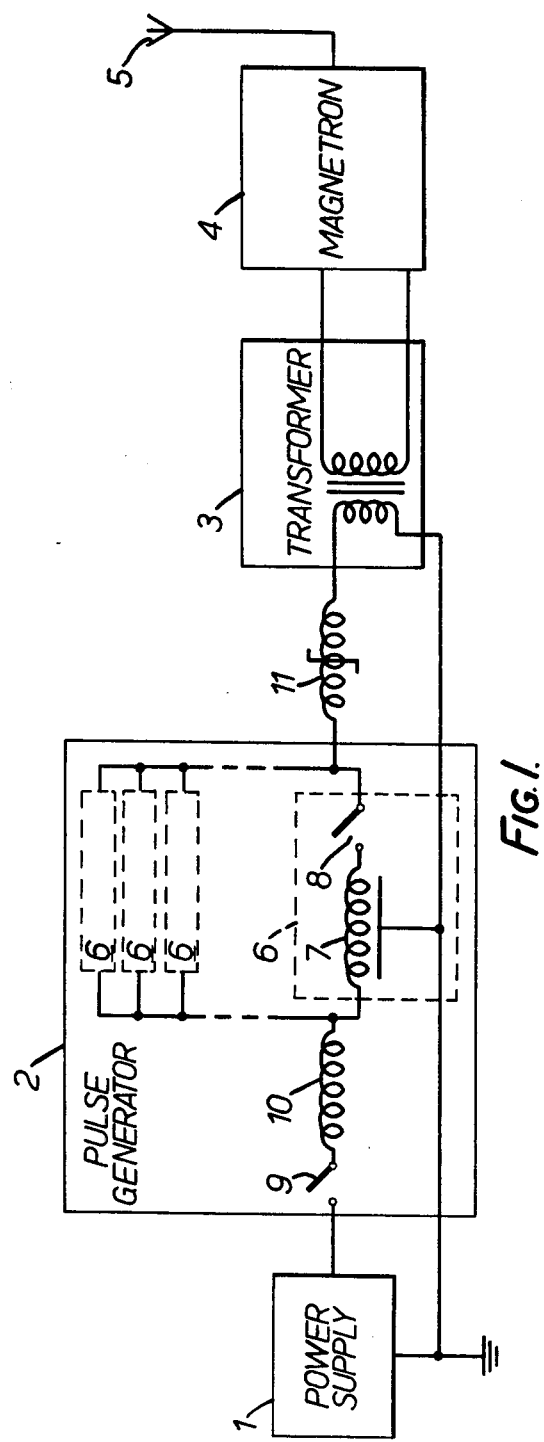
FIG. 1 shows a pulse circuit forming part of a radar transmitter and which includes a pulse generator.

FIG. 1 shows those parts of a radar transmitter which are relevant to an understanding of the present invention. The radar transmitter transmits very short pulses having a very high carrier frequency (usually in the microwave band), and during the interval (usually termed the inter-pulse period) following the cessation of each pulse, a radar receiver (not shown) receives relatively weak echoes of the transmitted pulse which is reflected by targets. The echoes may be very weak indeed and they are often difficult to detect from the background noise. Consequently, it is important that the radar transmitter itself does not generate electrical noise during the intervals between transmitted pulses. In order to maximise the level of the echo signals, the power of the transmitted pulses is made as large as possible, and the radar system must be designed with care to ensure that these pulses which have a very high power level decay very rapidly so that weak echo signals which occur immediately afterwards can be detected. Thus FIG. 1 shows just those parts of a radar transmitter which are concerned with the generation of very short but high power pulses.

A d.c. power supply 1 generates an output voltage of about 600 volts and applies it to a pulse generator 2 which is operative to utilise this d.c. voltage to produce a sequence of pulses having a low mark-to-space ratio corresponding to the pulses which are to be transmitted by the radar. These low voltage pulses are transformed by a pulse transformer 3 from the 600 volt level up to about 30 kV so that they can be used to drive a magnetron 4. A magnetron is a relatively efficient and satisfactory generator of microwave power, but it requires the application of a high operating voltage. The output of the magnetron 4 is transmitted via a radar antenna 5. The magnetron 4 is such as to oscillate at microwave frequencies whenever a sufficiently high voltage is applied to it, and the shape of the transmitted pulses and the efficiency with which they are transmitted is primarily dependent on the nature of the pulses generated at the pulse generator 2 and the way in which they are transformed from a low voltage to a high voltage by the transformer 3.

The pulse generator 2 utilises a number of pulse forming networks to generate an output pulse having the required characteristic. A pulse forming network consists of a distributed network of inductance and capacitance, and during the inter-pulse periods the network is charged from the power supply 1 via the charging inductor. As the inter-pulse periods are long compared to the pulse periods themselves, the pulse forming networks are charged over a relatively long period at a moderate current. A mark-to-space ratio of the order of 1 to 1000 is typical of many radars. When an output pulse is required the pulse forming networks are discharged rapidly. The characteristics of the pulse forming networks enable relatively rectangular pulses to be produced—that is to say, flat-topped pulses having very steep rising and falling edges. It is these pulses which are transformed by the transformer 3 to the high voltage of about 30 kV which is necessary to drive the magnetron 4. It will be appreciated that the switches which are used to discharge the pulse forming networks must conduct a great deal of current and must be relatively robust and reliable. In FIG. 1, these switches are constituted by thyristors, which are solid state devices and at the present time cannot reliably withstand voltages much greater than 1000 volts. Therefore in order to achieve the necessary power levels a number of pulse forming networks together with their respective switches are connected in parallel. Typically, at least eight such pulse forming networks are connected in parallel.

Only one of the pulse modules is shown in detail, but all are identical to each other. Each module 6 consists of a pulse forming network 7 comprising a network of distributed inductance and capacitance, connected in series with a thyristor 8. The modules 6 are connected in parallel with each other, and to the power supply 1 via a common switch 9 and an inductor 10. The modules 6 are coupled to the primary winding of the transformer 3 via a saturable reactor 11.

Briefly, the operation of the radar system shown in FIG. 1 is as follows. Initially, the switches 8 and 9 are non-conductive and the pulse forming networks 7 are assumed to be fully discharged. Switch 9 is then closed so that all of the pulse forming networks 7 are charged from the 600 volt d.c. power supply 1 via the inductor 10—the inductor 10 is present to moderate the magnitude of the initial charging current when the switch 9 is first closed. The pulse forming networks 7 charge during the inter-pulse period, which can be relatively long so that they become fully charged. When an output pulse is required, the switches 8 are rendered conductive. As the switches 8 are solid state thyristors they take a finite time to change from a fully non-conductive state to a fully conductive state, and if appreciable current were allowed to flow through them during the transition phase a great deal of power would be dissipated within them. To prevent this happening the saturable reactor 11 is provided—it initially behaves as an inductor and therefore controls the rate at which the build up of current can occur, but it rapidly saturates and then behaves as a very low impedance resistor. The time taken to saturate is tailored to the switching time of the switches 8 so that once the switches 8 are fully conductive, the saturable reactor 11 appears in effect as a short circuit allowing the pulse forming networks 7 to very rapidly discharge. This rapid discharge is a high current pulse which is transformed by the transformer 3 up to the required operating voltage of the magnetron—typically about 30 kV.

Figure 2:
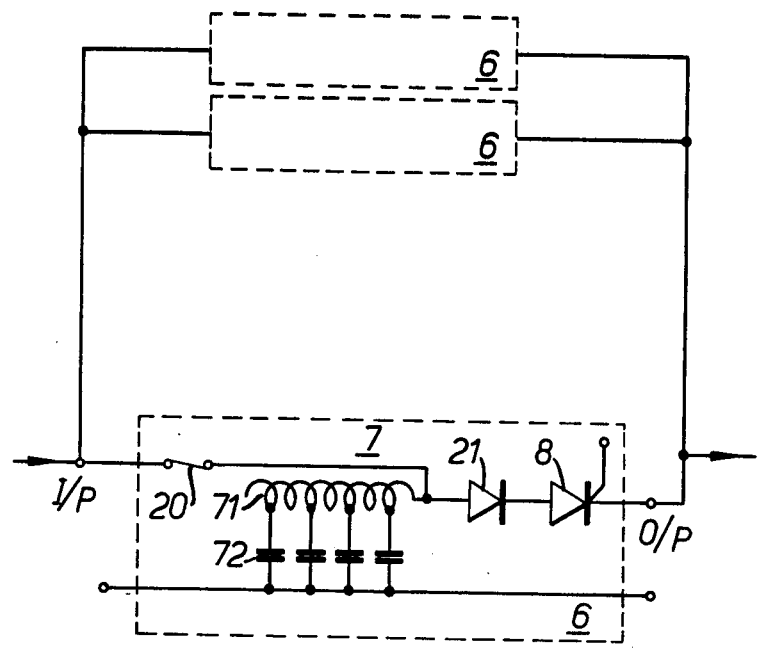
FIG. 2 shows the pulse generator in greater detail.

Because the switch 8 is a semiconductor thyristor, and cannot handle potentials greatly in excess of 1000 volts, it is necessary to provide a number of the modules 6 connected in parallel. Typically, at least eight such modules are provided and they are inter-connected in such a way as to permit continued operation of the pulse generator in the event that one or more of the modules fail. One module is shown in greater detail in FIG. 2 in which it will be seen that a fuse 20 is connected at its input end and a diode 21 is provided in the output path so that it is in series with the thyristor which constitutes the switch 8. The pulse forming network 7 is shown as consisting of an inductor 71 having capacitors 72 connected between points along the length of the inductance and the return rail.

The fuse 20 acts to isolate a particular module if it becomes a short circuit thereby permitting the remaining modules to continue operation. In this event the diode 21 becomes reverse biassed when the remaining modules are charged, and prevents the defective module drawing current from them.

The shape and duration of the pulse generated by the pulse forming network must be carefully controlled in order to transfer the energy to the magnetron with acceptable efficiency. The control of the pulse shape is particularly severe in the present circumstances where many individual modules are connected in parallel, and the resulting pulse shape is therefore determined by the combined influences of the separate pulse forming networks. It is important to ensure that each pulse forming network has a very similar characteristic and this is difficult to achieve in a reliable and economical manner whilst at the same time allowing the very large currents to be handled.

Figure 3:
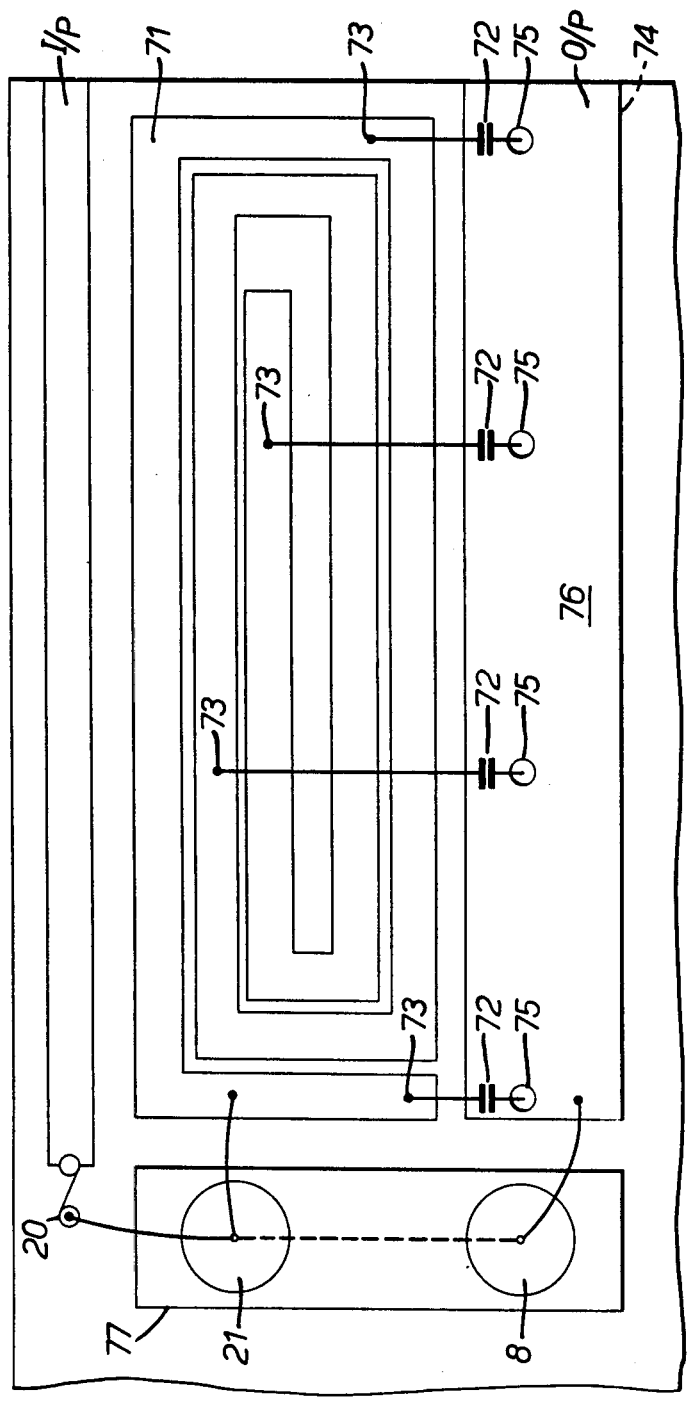
FIG. 3 shows a schematic lay-out of a pulse forming network.

Each pulse forming network 7 consists of an inductor having a number of capacitors connected so as to form a distributed delay line. The inductor is formed by means of printed circuit board techniques and it is constituted by two mirror image coils formed on opposite sides of a common insulating circuit board 70. A schematic layout of one side of the printed circuit board is shown in FIG. 3. The shape of the coil 71 is apparent from this drawing and the two mirror-image coils are connected together by conductive links passing through the thickness of the board at spaced intervals 73 along their lengths so that together they behave as a single inductor. Because the inductor is provided by two coils 71 one on either side of a printed circuit board, it is capable of handling very high currents. Furthermore, conductive patterns can be produced on insulating boards using printed circuit techniques to a very high degree of accuracy and consistency. This means that tolerancing problems generally encountered in manufacturing precision inductors are easily satisfied since it is only necessary to produce a master pattern having the required shape and dimensions. Once a pulse forming network having the required characteristic has been manufactured, subsequent pulse forming networks having identical properties can readily be duplicated with the expenditure of very little trouble. Four capacitors 72 are connected to different points along the coil 71 to a large conductive pad 74 on the under side of the board 70. The capacitor leads pass through holes 75 formed in the board 70 and through windows formed in a large conductive pad 76 on the top side of the board. The thyristor 8 and the diode 21 are both mounted on a heat sink 77 on the upper surface of the printed circuit board so as to minimise the lengths of the electrical interconnections. The two pads 76 and 74 carry the pulse and return currents, and thereby minimise inductive coupling. The use of these two conductive tracks on opposite sides of the board minimise the path inductance, since once a pulse of the required shape and duration has been generated it has to be transferred to its point of utilisation over a path having minimum resistance and inductance. A significant inductance at this point would seriously degrade the leading and trailing edges of the pulses. The remaining connections are shown by broken line for those on the under side of the board, and by solid line for those on the upper surface, and it will be seen that the circuit layout shown in FIG. 3 corresponds to that shown diagrammatically in FIG. 2.

Figure 4:
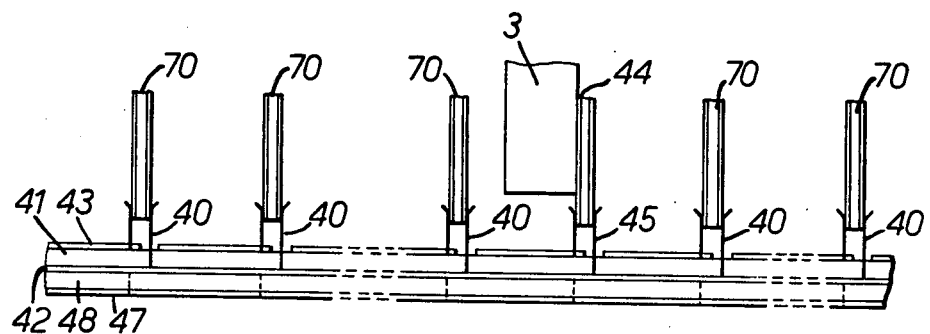
FIG. 4 shows a number of pulse forming networks connected in parallel so as to provide a high power output pulse.

As will be apparent from FIG. 1, the output points of the modules are connected together in parallel and fed via a saturable reactor 11 to a transformer 3. It is very difficult to connect all of the modules to the transformer whilst utilising very short electrical interconnections. The arrangement shown in FIG. 4 allows these modules to be connected to the transformer 3 via plug-in connectors 40, whilst minimising the inductance and resistance associated with the interconnections. A double sided mother board 41 is used to support the individual modules 6. Conveniently two modules are mounted on each board side by side, to minimise the number of separate plug in boards that are required. The mother board has three conductive layers 42, 43, 47 spaced apart by two insulating plates 41, 48. The high current pulse, and each return path consists of wide, low resistive tracks constituted by the layers 42 and 43. The third layer 47 is for control and synchronisation purposes, and it also carries the input path to each module. Similarly a double sided board 44 is used to connect the transformer 3 to the mother board 41 via a further connector 45, and conveniently the saturable reactor 11 can be mounted on this board 44.

For stringent interconnection requirements, the design impedance of each arm of the mother board interconnection can be made the same as the discharge path of each module 6. In this way the lumped constants of inductance and capacitance exhibit a fixed delay rather than individual capacitance and inductance effects.

The use of double sided printed circuit boards for the pulse circuit enables the various conflicting design constraints to be satisfied. The use of the multi-layer mother board to connect all modules carrying the pulse forming networks to the transformer enables the inductance of the connecting path to be minimised and since the whole width of the printed circuit board can be used to carry the pulses, its resistance is kept to an absolute minimum. By forming the inductor in each pulse forming network as two mirror image coils formed on opposite sides of a printed circuit board, the current carrying capacity of the coil is maximised—(if the coil were formed just on one side of a printed circuit board, the width of its tracks would have to be increased to enable sufficient current to be carried without unacceptable resistive losses). In this way, the surface area of a printed circuit board which each inductor occupies is minimised and kept to an acceptable level whilst enabling the electrical requirements of the pulse forming network to be satisfied in a very satisfactory manner—the characteristics of each pulse forming network are consistent and accurately predictable.

We claim:

1. A pulse circuit including a plurality of pulse forming networks, each network comprising an inductor formed as a coiled thin conductive layer lying on the surface of an electrically insulating board, and a plurality of capacitors mounted on the board and electrically connected to predetermined points of the conductive track; the networks being mounted on a common multi-layer printed circuit board which connects the outputs of the plurality of pulse forming networks in parallel to a common load, two conductive layers of the common board constituting respective current flow and return paths to minimise the inductance of the connection; and means for periodically charging and then discharging the inductor and the capacitors of the networks to generate an electrical pulse of predetermined characteristics.

2. A pulse circuit as claimed in claim 1 and wherein, for each network, inductive tracks composed of thin conductive layers are formed on both sides of the electrically insulating board so as to be aligned with each other.

3. A pulse circuit as claimed in claim 1 or 2 and wherein the networks are arranged to be charged from a common source prior to discharge into the common load.

4. A pulse circuit as claimed in claim 3 and wherein a third conductive layer of the common board is used to supply a common input signal, and control signals to each of the pulse forming networks.

5. A pulse circuit as claimed in claim 1 or 2 and wherein a third conductive layer of the common board is used to supply a common input signal, and control signals to each of the pulse forming networks.

* * * * *